United States Patent
Beesch et al.

[11] Patent Number: 5,609,490
[45] Date of Patent: Mar. 11, 1997

[54] METHOD AND APPARATUS FOR ATTACHMENT OF EDGE CONNECTOR TO SUBSTRATE

[75] Inventors: DiAnn J. Beesch, Jupiter; Duane J. Enck, West Palm Beach; Janet Dieb, Boynton Beach, all of Fla.

[73] Assignee: Motorola, Inc., Schaumburg, Ill.

[21] Appl. No.: 391,844

[22] Filed: Feb. 22, 1995

[51] Int. Cl.⁶ ............................................. H05K 3/34
[52] U.S. Cl. ........................ 439/79; 29/843; 228/180.22
[58] Field of Search ......................... 439/79, 80, 326, 439/876; 29/840, 843; 228/180.22

[56] References Cited

U.S. PATENT DOCUMENTS

| | | | |
|---|---|---|---|
| 5,311,405 | 5/1994 | Tribbey et al. | 361/767 |
| 5,415,573 | 5/1995 | Chen et al. | 439/876 |

FOREIGN PATENT DOCUMENTS

| | | | |
|---|---|---|---|
| 4-177792 | 6/1992 | Japan | 29/843 |

OTHER PUBLICATIONS

Toddco General, Inc., PCMCIA Memory Card Connector Assembly System, Model TRSM 1010A Brochure.

*Primary Examiner*—Neil Abrams
*Attorney, Agent, or Firm*—Aaron Bernstein; Philip P. Macnak

[57] ABSTRACT

A method and apparatus attach a connector (17) to an edge (32) of a substrate (18) such that an electrical connection is formed between the circuits on the substrate (18) and the leads (12, 14) on the connector (17). A connector (17) is provided having leads arranged into a top row (12) and a bottom row (14) extending horizontally therefrom. A substrate (18) is provided having a row of solder bumps (20) on a bottom side to correspond with the bottom row of leads (14) of the connector (17) and a row of solder paste pads (22) on a top side to correspond with the top row of leads (12) of the connector (17). The edge (32) of the substrate (18) is approached with the connector (17) at an angle, straddling the edge (32) with the top row (12) and the bottom row (14) of leads, and rotating the connector (17) into parallel alignment with the substrate (18). The substrate (18) is heated to reflow, such that the row of solder paste pads (22) on the top side of the substrate (18) liquefies and flows onto a row of connection sites, thereby contacting the top row of leads (12). The row of bumps (20) on the bottom side of the substrate (18) wets the row of bottom leads (14), thereby forming the electrical connection.

6 Claims, 4 Drawing Sheets

METHOD AND APPARATUS FOR ATTACHMENT OF EDGE CONNECTOR TO SUBSTRATE

FIELD OF THE INVENTION

This invention relates in general to a method and apparatus for attaching an edge connector to a substrate and the product produced by this method. More particularly, this invention relates to a method and apparatus for automated attachment of the leads of an edge connector to the printed circuit substrate of an expansion module and the PCMCIA card resulting therefrom.

BACKGROUND OF THE INVENTION

PCMCIA is an acronym for Personal Computer Memory Card International Association. This association developed a set of standards designed to make computer expansion easier. PCMCIA cards (also known as PC Cards) can be used, for example, to add memory or input/output capabilities to computers in credit card size packaging. These credit card sized expansion modules fit into a variety of computing products, including desktop and laptop computers.

Leading market research firms have indicated that by the year 1996 the number of users of pocket-size, hand-held and portable computing and communicating devices with the PCMCIA standard could escalate to nearly 10 million. There are basically three standard types of PCMCIA slots for these cards: Type I-(3 mm slot), Type II-(5 mm slot), and Type III-(10 mm slot). Various sized cards slide into appropriately sized slots much like a floppy disc fits into a drive.

PCMCIA cards generally comprise a credit card sized printed circuit board or substrate (PCB), having a number of integrated circuits and components soldered thereto. The PCMCIA card includes a connector soldered onto an edge thereof to interconnect with a host device. The interconnection between the circuitry of the PCMCIA card and the host device includes a pin and socket configuration. The PCMCIA connector for a Type II card, for example, comprises a configuration of 68 sockets or holes which are designed to electrically interface with mating 68 pins of a connector within the host device.

With these strict size standards, special considerations must be made in the selection of thin line and fine pitched components. Using these components in PCMCIA cards will require higher standards in the manufacturing process, including automation.

In the manufacturing of PCMCIA cards, the small size of the connector and the high number of electrical connections between the connector and the circuitry of the card itself makes precise manual placement of the connector onto the card a tedious and time consuming process. Manual placement increases the chance for defects due to misalignment or mishandling. A solution to this problem would be to provide an automated process of attaching the connector to the PCB.

A number of assembly problems arise during the placement and attachment of the PCB between the connector leads. First of all, as shown in FIG. 1, since the distance between the top connector leads 12 and bottom connector leads 14 is usually less than 0.02 inches (0.508 mm) in the straight leaded straddle-mount connectors 15 used in the industry, it is difficult to manually assemble and practically impossible to assemble in an automated process due to the likelihood of lead interference with the edge of the PCB 18 and the solder bump 20 during the attachment process.

A second type of connector available is the compression fit, straddle-mount connector 16 shown in FIG. 2. This type of connector 16 has a radius in the top leads 12 to accommodate angled insertion of the PCB 18 by providing a type of "lead in" ramp 11. The range of clearance when the connector is initially attached at a 22.5° angle of attack is approximately 0.041 inches±0.005 inches (1.0414 mm±0.127 mm). This "angle of attack" insertion method aids in the assembly process by providing a larger target area decreasing the need for exact z-axis (vertical/up-down) alignment. However, this "lead-in" ramp 11 still requires nearly exact alignment, which is difficult to accomplish in an automated manufacturing process, since the range of clearance is only approximately 0.04 inches (1.016 mm).

A solution to this problem would be to provide a type of compression fit, straddle-mount connector which has a greater clearance to provide for easier automation.

Alignment problems also exist in the automated assembly of the cards. The edge of the PCB array onto which the connector is attached is usually straight with no accommodations for alignment in the x (horizontal/side-to-side), y (horizontal/front-to-back), or z (vertical/up-down) axes. A solution to this problem would be to provide a number of alignment mechanisms along each of the three axes to assist in overall alignment during the automated process.

Another problem arises with respect to the soldering process. During assembly, solder paste is generally applied to the PCB prior to attachment of the connector. Because of the close fit of the PCB between the leads, the solder paste is usually displaced due to driving the leads directly into the paste on the PCB leading to faults in the connection and shorts.

Furthermore, an x-axis (horizontal) warping problem arises in the pre-soldering of the PCB. Warping arises from various environments. Fabrication of the substrate material is one cause of warping. Even after the substrate has been leveled off, its memory elasticity from previous warping can cause warping again in the first reflow cycle.

A solution to this problem would be to provide a method of soldering which prevents this displacement of the solder paste and accommodates any warpage during the assembly process, resulting in precise and secure connections.

Thus, there is a need in the art for a method of automated attachment of the PCMCIA connector onto the PCB. This need includes a type of compression fit, straddle-mount connector which has a greater clearance to provide for easier automation and a number of alignment mechanisms along each of the three axes to assist in overall alignment of the connector onto the PCB during the automated assembly process. There is also a need for an improved solder paste screening method to avoid displacement of the solder paste which results in shorts.

SUMMARY OF THE INVENTION

An aspect of the present invention is a method for attaching a connector to an edge of a substrate such that an electrical connection is formed between a plurality of circuits on the substrate and a plurality of leads on the connector. The method comprises the steps of providing the connector, wherein the plurality of leads are arranged into a top row and a bottom row of leads, the rows extending substantially horizontally therefrom, and wherein the top row of leads of the connector provide compression when the edge of the substrate is inserted between the top row and the bottom row of leads of the connector, and wherein the bottom row of leads extends horizontally beyond the top row of leads. The method further comprises the steps of:

(a) reflowing a row of solder paste pads on a bottom side of the substrate to achieve a row of solder bumps corresponding with said bottom row of leads of said connector, wherein said row of solder paste pads are elongated to control crowning and to form a larger surface area for the bottom row of leads of the connector to make contact;

(b) following step (a), offset printing a row of solder paste pads on a top side of the substrate corresponding to said top row of leads of said connector, such that the solder paste pads are located a sufficient distance from a row of connection sites to prevent said top row of leads from displacing the row of solder paste pads during attachment of the connector;

(c) following step (b), approaching the edge of the substrate with the connector at an angle;

(d) following step (c), straddling the edge of the substrate with the top row and the bottom row of leads, such that the top row of leads rests on the top side of the substrate and the bottom row of leads rests against a bottom edge of the substrate;

(e) following step (d), rotating the connector into parallel alignment with the substrate such that the bottom row of leads registers with and contacts the row of solder bumps on the bottom side of the substrate and the top row of leads registers with and contacts the row of connection sites; and (f) following step (e), heating the substrate to reflow, wherein the row of solder paste pads on the top side of the substrate liquefies and flows onto the connection sites, thereby contacting the top row of leads, and wherein the row of solder bumps on the bottom side of the substrate wets the bottom row of leads, thereby forming the electrical connection.

DESCRIPTION OF THE PREFERRED EMBODIMENT

Figure 1:
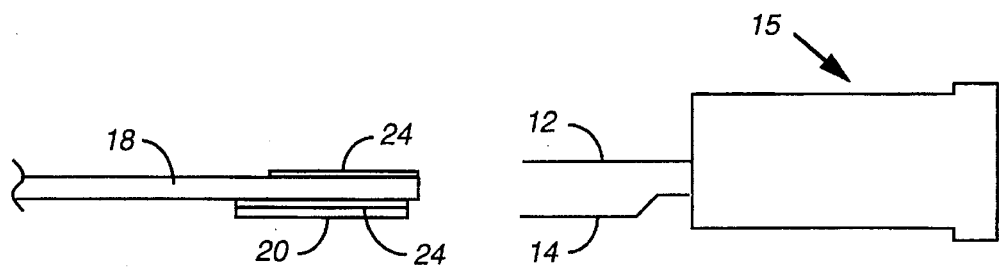
FIG. 1 is a side view of a straight leaded straddle-mount connector and a partial side view of a PCB prior to assembly.
Figure 2:
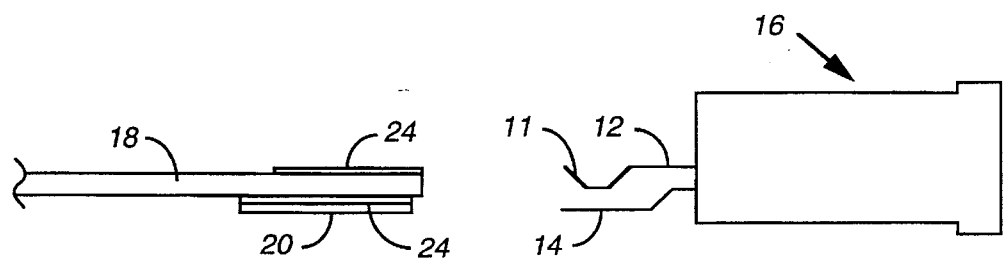
FIG. 2 is a side view of a compression fit, straddle-mount connector and a partial side view of a PCB prior to assembly.
Figure 3:
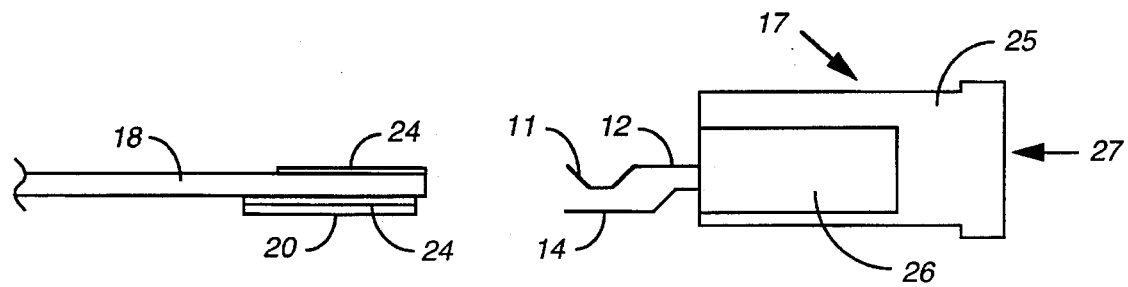
FIG. 3 is a side view of an improved compression fit, straddle-mount connector and a partial side view of a PCB prior to assembly in accordance with the preferred embodiment of the present invention.

Referring initially to FIG. 3, in a preferred embodiment, the improved compression fit, straddle-mount connector 17 and a partial side view of a PCB 18 prior to assembly is shown. The connector 17 is used to provide the electrical interface between the PCB 18 and the mating connector of the host device (not shown), such as a portable computer or communication device. In a preferred embodiment, the connector 17 comprises a narrow strip of plastic 25 or other non-conducting material having a series of sockets 27 (Shown in FIG. 6) along one edge and a series of leads 12, 14 corresponding to each of the holes 27 along an opposite edge. In a 68 pin connector, the leads 12, 14 are arranged into two rows of thirty-four leads each. In the assembly process, the leads 12, 14 are soldered to the PCB 18 to provide the electrical connection between each of the sockets 27 and the circuitry on the PCB 18. The PCB 18 can include a number of electronic components (not shown) that support the function of the PCMCIA device. These functions can include extra memory, modem capabilities or input/output interfacing.

In a 68 pin compression fit, straddle-mount connector 17, the top row of leads 12 have a radius defined therein. Specifically, the top leads 12 extend horizontally out from the connector 17 defining a first horizontal section. The leads 12 then ramp down at approximately a 45° angle toward the bottom leads 14. The leads 12 then extend horizontally for a short distance at a close range to the bottom leads 14 defining a second horizontal section and then ramp back up at approximately a 45° angle forming a "lead-in ramp" 11. The preferred length of the top leads is approximately 0.125 inches (3.175 mm).

Figure 4:
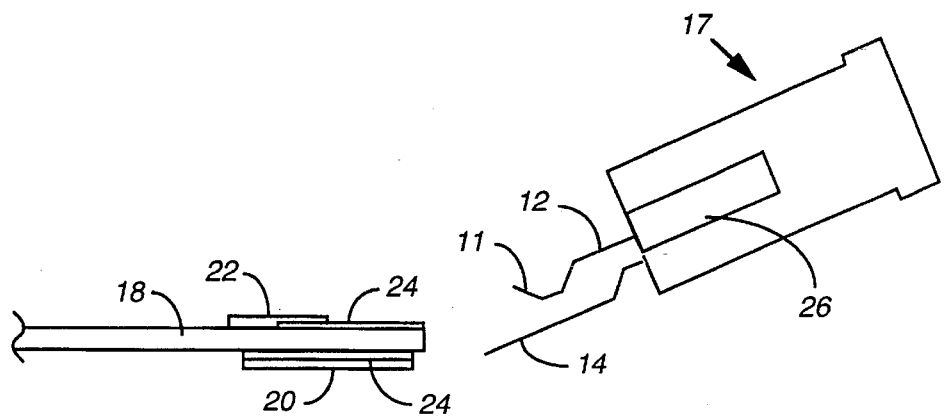
FIG. 4 is a side view of an improved compression fit, straddle-mount connector and a partial side view of a PCB showing the preferred 22.5° "angle of attack" prior to assembly in accordance with the preferred embodiment of the present invention. (The axis orientation for FIGS. 1–4 is as follows: the x-axis is normal to the page, the y-axis is left-to-right across the page, and the z-axis is top-to-bottom on the page.)

The bottom leads 14 extend horizontally out from the connector 17 defining a first horizontal section and then ramp downward at approximately a 45° angle. The leads 14 then extend horizontally therefrom defining a second horizontal section. The preferred overall length of the bottom leads 14 is approximately 0.177 inches (4.5 mm) rather than the standard 0.142 inches (3.6 mm). Accordingly, the bottom leads 14 extend beyond the length of the top leads 12, thereby increasing the range of clearance between the "lead-in ramp" 11 of the top leads 12 and the bottom leads 14 to approximately 0.056 inches±0.005 inches (1.422 mm±0.127 mm) when the connector 17 is initially attached at a 22.5° angle of attack, as shown in FIG. 4. Therefore the range of clearance is increased by 0.015 inches (0.381 mm) with the additional bottom lead length. This increase in clearance will reduce the criticality of the coplanarity of the lead specification, namely the vertical alignment will not be as crucial.

The close range between the top leads 12 and bottom leads 14, approximately 0.016 inches (0.406 mm), provides for a tight compression fit around a 0.021 inch±0.003 inch (0.533 mm±0.076 mm) thick prebumped PCB 18. The upward "lead-in ramp" 11 at the end of the top leads 12 provides a "lead-in" to ease the insertion of the PCB 18 between the top leads 12 and bottom leads 14.

Figure 5:
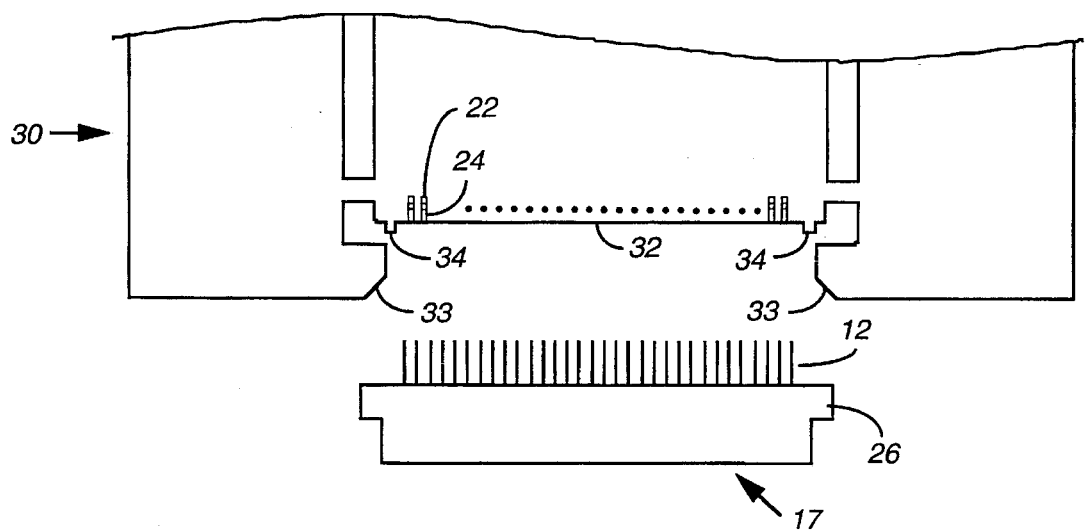
FIG. 5 is a partial top view of a PCB array illustrating the lead-ins and mechanical stops and the connector prior to attachment in accordance with the preferred embodiment of the present invention. (The axis orientation for FIG. 5 is as follows: the x-axis is left-to-right across the page, the y-axis is top-to-bottom on the page, and the z-axis is normal to the page.)
Figure 6:
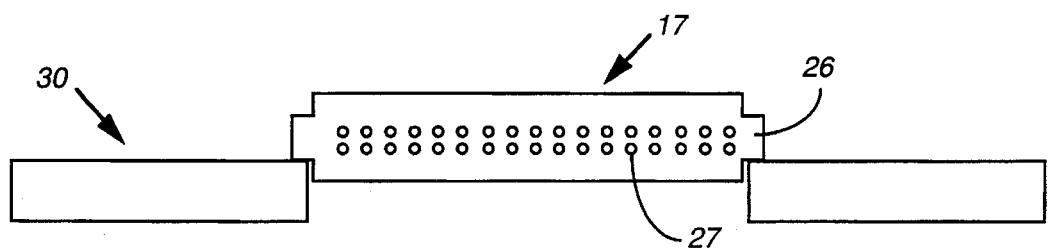
FIG. 6 is a rear view of a connector and a PCB array illustrating the side protrusions of the connector resting on the PCB array in accordance with the preferred embodiment of the present invention. (The axis orientation for FIG. 6 is as follows: the x-axis is left-to-right across the page, the y-axis is normal to the page, and the z-axis is top-to-bottom on the page.)

Turning now to FIGS. 5–6, the preferred PCB array configuration 30 is shown. The edge 32 of the PCB array 30 onto which the connector 17 is soldered is fabricated to assist in the automated attachment process. First of all, the array opening 33 is chamfered to function as a lead-in to guide the connector 17 into its proper x-axis (horizontal/side-to-side) location, as shown in FIG. 5. The edge 32 of the PCB array includes two small tabs 34 functioning as mechanical stops for proper y-axis alignment (horizontal/front-to-back). Finally, turning now to FIG. 6, a rear view of a connector 17 resting on a PCB array 30 is shown. The body of the connector 17 includes protrusions 26 on each side. These protrusions 26 act as vertical supporting structures for center of gravity of the connector 17 during reflow by resting on the PCB array 30. These protrusions 26 also aid in positioning the PCB in the housing frame to accommodate for two sided circuitry.

The steps of the preferred method generally include approaching the edge 32 of the PCB array 30 with the connector 17 at an angle, preferably by rotating the connector 17 to an angle of substantially 22.5°; straddling the edge 32 of the PCB array 30 with the top row 12 and the bottom row 14 of leads, such that the top row 12 of leads rests on the top side of the PCB array 30 and the bottom row 14 of leads rests against a bottom edge of the PCB array 30; rotating the connector 17 into parallel alignment with the PCB array 30 such that the bottom row 14 of leads registers with and contacts the row of solder bumps 20 on the bottom side of the PCB 18 and the top row 12 of leads registers with and contacts a row of connection pads 24; and heating the PCB array 30 to reflow, such that the row of solder paste pads 22 on the top side of the PCB 18 liquefies and flows into contact with the top row of leads 12, and the row of bumps 20 on the bottom side of the PCB 18 wets the row of bottom leads 14, thereby forming the electrical connections.

Specifically, at a first solder printing of the PCB 18, paste is applied to the bottom lead pads and then reflowed to achieve solder bumps 20. The bumps 20 are elongated to control the crowning of the solder and form a larger surface area for the leads to make contact, as shown in FIG. 3. Any bottom side components are preferably placed during this soldering step.

Figure 7:
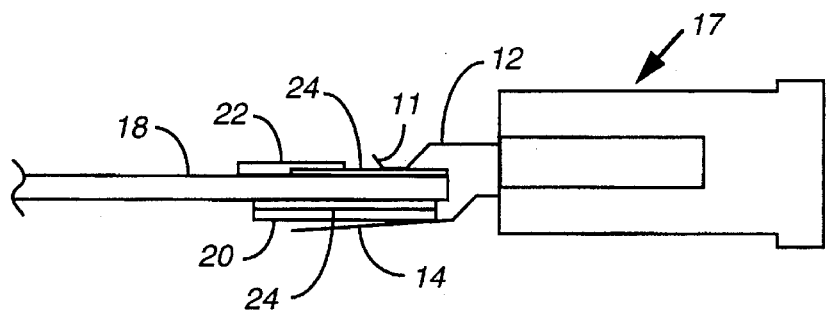
FIG. 7 is a partial side view of an improved compression fit, straddle-mount connector with the PCB inserted between the top and bottom leads prior to reflow of the offset top solder paste pads.
Figure 8:
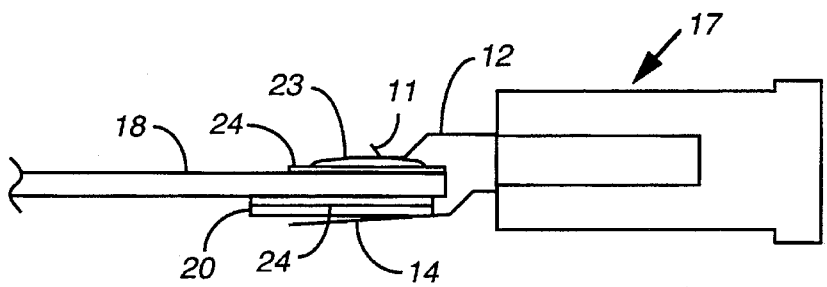
FIG. 8 is a partial side view of an improved compression fit, straddle-mount connector with the PCB inserted between the top and bottom leads after reflow of the offset top solder paste pads. (The axis orientation for FIGS. 7–8 is as follows: the x-axis is normal to the page, the y-axis is left-to-right across the page, and the z-axis is top-to-bottom on the page.)
Figure 9:
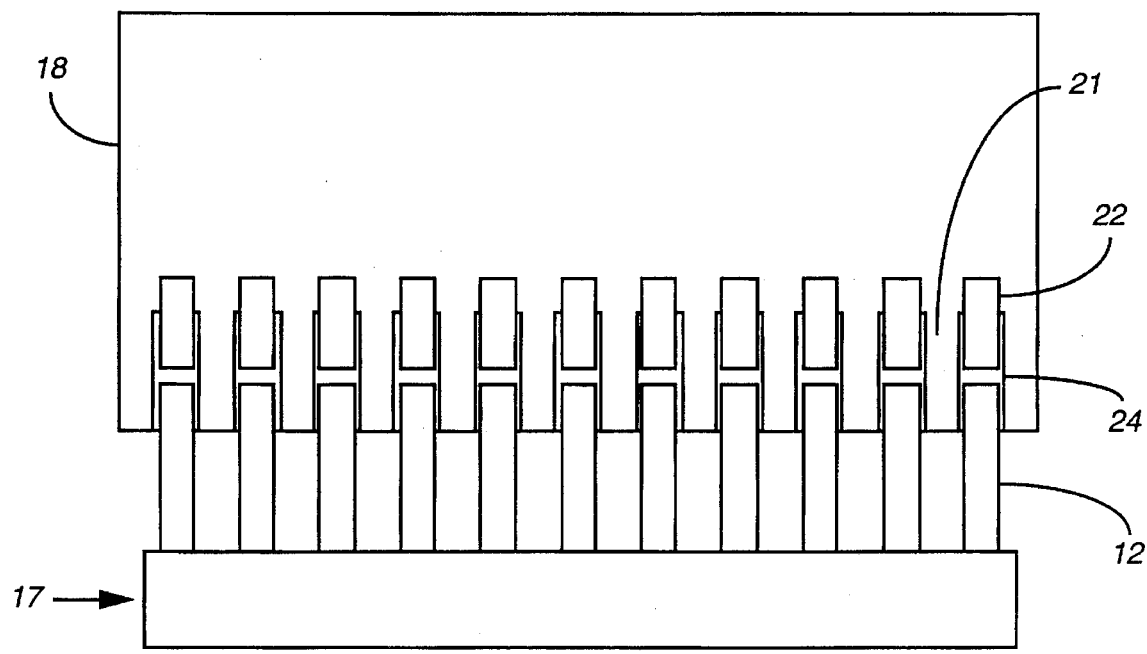
FIG. 9 is a partial top plan view of an improved compression fit, straddle-mount connector with the bumped PCB inserted between the top and bottom leads prior to reflow of the offset top solder paste pads. (The axis orientation for FIG. 9 is as follows: the x-axis is left-to-right across the page, the y-axis is top-to-bottom on the page, and the z-axis is normal to the page.)

Referring to FIGS. 7–9, side views show the top solder paste pads 22 positioning with respect to the connector leads 12 on top of the PCB 18 before and after reflow, respectively, in accordance with the preferred embodiment of the invention. An offset method is utilized to print solder paste pads 22 to the top lead connector pads 24 of the PCB 18. The offset solder paste pads 22 will draw onto the leads 12 during a second reflow after the connector 17 is attached forming the solder bump connection 23. The advantage of using this offset method is that during attachment of the connector 17 to the PCB 18, the top leads 12 of the connector 17 will not displace the solder paste pads 22 resulting in faulty solder connections and/or shorts. Specifically described, the solder paste pads 22 are applied to the printed circuit board 18 slightly offset from the actual connection pads 24 as shown in FIG. 9. The pads 24 are separated by solder resist 21. The connector 17 can then be placed onto the PCB 18 without the top leads 12 contacting and displacing the solder paste pads 22. During reflow, the solder paste pads 22 are drawn onto the leads 12 as shown in FIG. 8 forming the solder bump connection 23.

In the automated process, after solder printing on the bottom and reflow to achieve bottom solder bumps 20 and after offset printing of the solder paste pads 22 onto the top-lead connector pads 24, the PCB array 30 is placed onto a pallet (not shown). The pallet travels to the over-the-conveyor (OTC) PCMCIA assembly station (not shown). Utilizing a standard three axis material handler (not shown), the connectors 17 are vacuum picked from a tray and placed into a connector nest. The connector tip will retract leaving a six finger vacuum end-effector to lift the array 30 from the pallet and place it into the nest of the attachment mechanism.

To eliminate warping along the x-axis during assembly, the array 30 is compressed between its nest and an upper plate. The mechanism utilizes a unique method of placement which applies an "angle of attack" approach.

Figure 10:
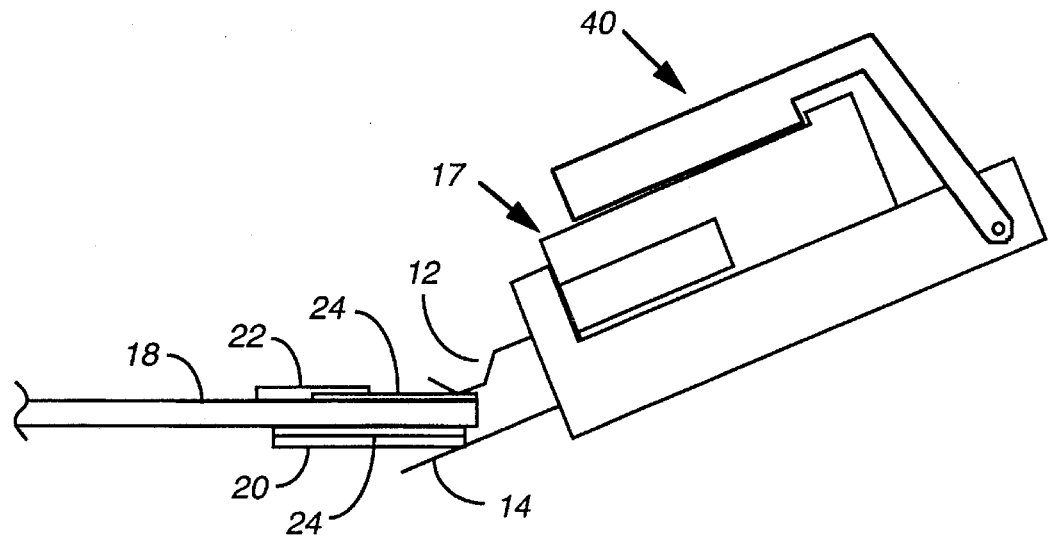
FIG. 10 is a side view of an improved compression fit, straddle-mount connector within the clamp and a partial side view of a PCB showing the preferred 22.5° "angle of attack" prior to assembly in accordance with the preferred embodiment of the present invention.
Figure 11:
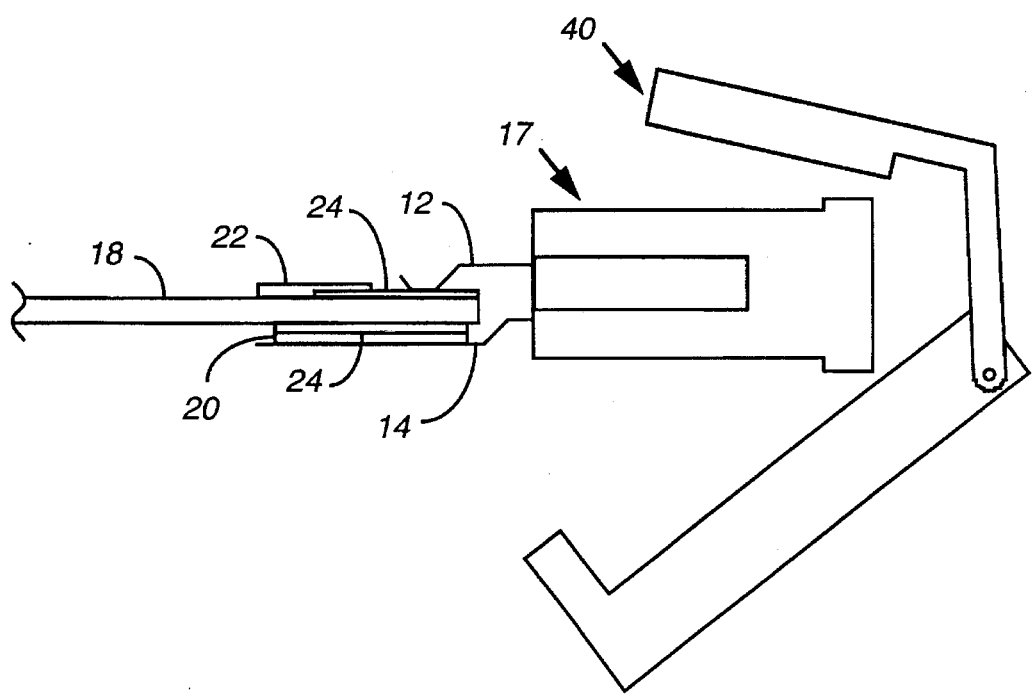
FIG. 11 is a side view of an improved compression fit, straddle-mount connector and a partial side view of a PCB after assembly as the clamp is removed in accordance with the preferred embodiment of the present invention. (The axis orientation for FIGS. 10–11 is as follows: the x-axis is normal to the page, the y-axis is left-to-right across the page, and the z-axis is top-to-bottom on the page.)

Turning now to FIGS. 10–11, prior to transport, the clamp 40 will rotate to create the optimum angle of attack for positioning the connector leads 12, 14 at the PCB array edge 32. FIG. 10 is a side view of the connector 17 within the clamp 40 and a partial side view of a PCB 18 showing the preferred 22.5° "angle of attack" during assembly. The mechanism supporting the clamp 40 and connector 17 is actuated forward towards the PCB array 30. Once the connector leads 12, 14 are straddling lo the array 30, the clamp 40 follows a radial path forward into the horizontal position (shown in FIG. 11).

The connector 17, in its proper position, is then released from the nest and the device retracts to the loading position. FIG. 11 is a side view of the connector 17 and a partial side view of a PCB 18 after assembly as the clamp 40 is removed.

The material handler loads new connectors into the assembly mechanism and awaits the next pallet.

The top side components (not shown) are then placed onto the PCB array 30 and the solder is then reflowed. During this reflow, the offset top-lead solder paste pads 22 are drawn onto the leads 12 forming the necessary solder bump connections 23.

A number of advantages arise from practice of this method and apparatus for attaching an edge connector to a printed circuit board and the product produced by this method. First of all, the compression fit, straddle-mount connector 17 with extended bottom leads 14 provides greater clearance to ease automation. Additionally, the offset method of soldering prevents displacement of the solder paste pads 22, resulting in precise and secure solder connections 23. Finally, the alignment mechanisms, such as the lead-in 33 to guide the connector into its proper x-axis (horizontal/side-to-side) location, the small tabs 34 functioning as mechanical stops for proper y-axis (horizontal/front-to-back) alignment and the protrusions 26 which act as vertical supporting structures for center of gravity of the connector 17 during reflow by resting on the PCB array 30 all assist in overall alignment during the automated process.

Preferably, the following list of materials and equipment is utilized in accordance with the preferred embodiment of the present invention. It will be appreciated that other similar materials and equipment can be utilized as well.

| | |
|---|---|
| Connector 17 | Similar to part No. 90994-003 manufactured by Berg Electronics of Chapel Hill, NC, and modified in accordance with the preferred embodiment of the present invention. |
| PCB 18 | FR4 tetra polyclad PCL-FR-226. |
| Bottom lead pads | ½oz copper with "Entek 106A" surface coating. |
| Solder bumps 20 | Kester R241 solder paste, pre-reflowed. |
| Top lead connector pads 24 | ½oz copper with "Entek 106A" surface coating. |
| Solder paste pads 22 | Kester R241 solder paste. |
| Clamp 40 | Aluminum with stainless steel hardware. |
| Solder printing stencil | stainless steel, manufactured by Photo Stencil, Inc. of Colorado Springs, CO. |
| Pallet | Aluminum, custom machined. |
| Material handler | Model RF/DC/12RF/30/360/50/K Hydraulic and Pneumatic Engineering Co. of Deerfield, FL. |
| Reflow oven | BTU TRS14 forced convection oven having a nitrogen atmosphere and a peak temperature of 225 degrees Celsius. |

Thus, it is apparent that there has been provided, in accordance with the invention, a method and apparatus for attaching edge connector to a printed circuit board and the product produced by this method. While the invention has been described and illustrated with reference to specific embodiments thereof, it is not intended that the invention be limited to these illustrative embodiments. Those skilled in the art will recognize, after review of the foregoing description, that variations and modifications differing from the illustrative embodiments are possible. It is intended that all such variations and modifications as fall within the spirit and scope of the invention be included within the appended claims.

What is claimed is:

1. A method for attaching a connector to an edge of a substrate such that an electrical connection is formed between a plurality of circuits on the substrate and a plurality of leads on the connector comprising the steps of:

providing the connector, wherein the plurality of leads are arranged into a top row and a bottom row of leads, the rows extending substantially horizontally therefrom, and wherein the top row of leads of the connector provide compression when the edge of the substrate is inserted between the top row and the bottom row of leads of the connector, and wherein the bottom row of leads extends horizontally beyond the top row of leads;

(a) reflowing a row of solder paste pads on a bottom side of the substrate to achieve a row of solder bumps corresponding with said bottom row of leads of said connector, wherein said row of solder paste pads are elongated to control crowning and to form a larger surface area for the bottom row of leads of the connector to make contact;

(b) following step (a), offset printing a row of solder paste pads on a top side of the substrate corresponding to said top row of leads of said connector, such that the solder paste pads are located a sufficient distance from a row of connection sites to prevent said top row of leads from displacing the row of solder paste pads during attachment of the connector;

(c) following step (b), approaching the edge of the substrate with the connector at an angle;

(d) following step (c), straddling the edge of the substrate with the top row and the bottom row of leads, such that the top row of leads rests on the top side of the substrate and the bottom row of leads rests against a bottom edge of the substrate;

(e) following step (d), rotating the connector into parallel alignment with the substrate such that the bottom row of leads registers with and contacts the row of solder bumps on the bottom side of the substrate and the top row of leads registers with and contacts the row of connection sites; and (f) following step (e), heating the substrate to reflow, wherein the row of solder paste pads on the top side of the substrate liquefies and flows onto the connection sites, thereby contacting the top row of leads, and wherein the row of solder bumps on the bottom side of the substrate wets the bottom row of leads, thereby forming the electrical connection.

2. The method of claim 1, further comprising, after the step of approaching said substrate, the steps of providing a pair of chamfered margins along each side of said edge which function as a lead-in guide for said connector for guiding said connector into a proper horizontal/side-to-side alignment;

providing a pair of tabs along said edge which function as mechanical stops for said connector for securing said connector into a proper horizontal/front-to-back alignment; and providing a pair of protrusions extending out from each end of said connector which act as vertical supporting structures for maintaining said connector in a proper vertical alignment.

3. The method of claim 1, further comprising, prior to said heating step, the step of placing a plurality of top side components on said substrate, wherein said components are electrically connected to said connection sites by a series of runners.

4. The method of claim 1, wherein said step of approaching said substrate comprises rotating said connector to an angle of substantially 22.5°.

5. An expansion module having a connector attached to a printed circuit substrate of said expansion module by the method of claim 1.

6. The method of claim 1, wherein the row of solder paste pads applied to the substrate overlap onto solder resist included in the substrate, and are electrically isolated by solder resist.

* * * * *